(12) United States Patent
Tomsic

(10) Patent No.: US 6,687,975 B2
(45) Date of Patent: Feb. 10, 2004

(54) METHOD FOR MANUFACTURING MGB$_2$ INTERMETALLIC SUPERCONDUCTOR WIRES

(75) Inventor: Michael J. Tomsic, Troy, OH (US)

(73) Assignee: Hyper Tech Research Inc., Troy, OH (US)

(*) Notice: Subject to any disclaimer, the term of this patent is extended or adjusted under 35 U.S.C. 154(b) by 218 days.

(21) Appl. No.: 10/085,748

(22) Filed: Feb. 28, 2002

(65) Prior Publication Data
US 2002/0198111 A1 Dec. 26, 2002

Related U.S. Application Data
(60) Provisional application No. 60/274,176, filed on Mar. 9, 2001.

(51) Int. Cl.$^7$ .............................................. H07L 39/24
(52) U.S. Cl. ........................ 29/599; 29/825; 174/125.1; 505/430; 505/433
(58) Field of Search ................ 29/599, 825; 174/125.1; 505/430, 433

(56) References Cited

U.S. PATENT DOCUMENTS 6,569,360 B2 * 5/2003 Wu ........................... 252/518.1
6,586,370 B1 * 7/2003 Holcomb ..................... 505/236

* cited by examiner

Primary Examiner—Carl J. Arbes
(74) Attorney, Agent, or Firm—Thomas S. Baker, Jr.

(57) ABSTRACT

There is disclosed a continuous process for the formation of a superconducting wire utilizing magnesium diboride powder. The process provides a long length, low cost strand of superconducting wire which can be used in a monofilament or multifilament form.

18 Claims, 3 Drawing Sheets

METHOD FOR MANUFACTURING MGB$_2$ INTERMETALLIC SUPERCONDUCTOR WIRES

CROSS REFERENCE TO RELATED APPLICATION

This application claims priority from U.S. Patent Application Ser. No. 60/274,176 filed Mar. 9, 2001.

FIELD OF THE INVENTION

The present invention relates to a process for the production of superconducting wires formed from intermetallic compounds based on Group IIA and Group IIIA elements of the Periodic Table (CAS Version), particularly magnesium diboride (MgB$_2$).

BACKGROUND ART

Superconductivity is a property of many metals, alloys and chemical compounds in which the electrical resistivity of the materials vanishes and the materials become strongly diamagnetic at temperatures near absolute zero.

In order for a material to exhibit superconducting behavior, the material must be cooled below a characteristic temperature, known as its superconducting transition or critical temperature ($T_c$), by approximately one-half of $T_c$. The $T_c$ of superconducting materials based on intermetallic compounds is approximately 20K. These intermetallic superconductors have been typically operated in a bath of liquid helium at a temperature of about 4K. It has, however, been recently reported that an intermetallic compound, specifically magnesium diboride, can have superconducting properties at around 40K. Thus, it would be possible to utilize magnesium diboride as a superconductor by cooling with a conventional closed-cycle refrigerator, which is capable of cooling objects to 20K with no liquid cryogens.

Wires made with superconducting materials provide significant advantages over conventional copper wires because they conduct electricity with little or no resistance and associate energy loss and can transmit much larger amounts of electricity than conventional wires of the same size.

In U.S. Pat. No. 4,980,964 there is taught a method of producing a superconducting wire. The wire is produced by filling a metal tube with a powder of ceramic superconductive material, sealing the tubes ends and drawing the filled, sealed tube through die of progressively smaller size until a predetermined wire size is achieved. The tube is then subjected to heat treatment to assure necessary crystallinity in the superconductor material.

U.S. Pat. No. 5,252,550 teaches a method of producing a superconducting composite wire in which a continuously supplied metal strip is formed into a flume shape, filled with a ceramic copper oxide superconducting powder material, rolled such that ends of the strip meet to form a tube, welded to form a seam, and sintered. The tube enveloping the sintered material is then deformed to a reduced cross section and subjected to a heat treatment. The superconducting material is a ceramic copper oxide.

In U.S. Pat. No. 6,289,576 there is taught a method for drawing elongated superconductive wires. Superconducting oxidic ceramic materials are worked to filamentary conductors by a silver tube as a sintered sleeve which is brought into contact with the ceramic material in a drawing sleeve of soft annealed steel and the resulting sleeve combination undergoes drawing stages.

SUMMARY OF THE INVENTION

There has now been found a process of continuously forming a superconducting wire containing a superconducting material of magnesium diboride powder. The process provides a long length, low cost strand of superconducting wire.

BRIEF DESCRIPTION OF THE DRAWINGS

FIG. 1a is a cross-sectional view along line 1a—1a of FIG. 1.

FIG. 1b is a cross-sectional view along line 1b—1b of FIG. 1.

DESCRIPTION OF THE INVENTION

Figure 1:
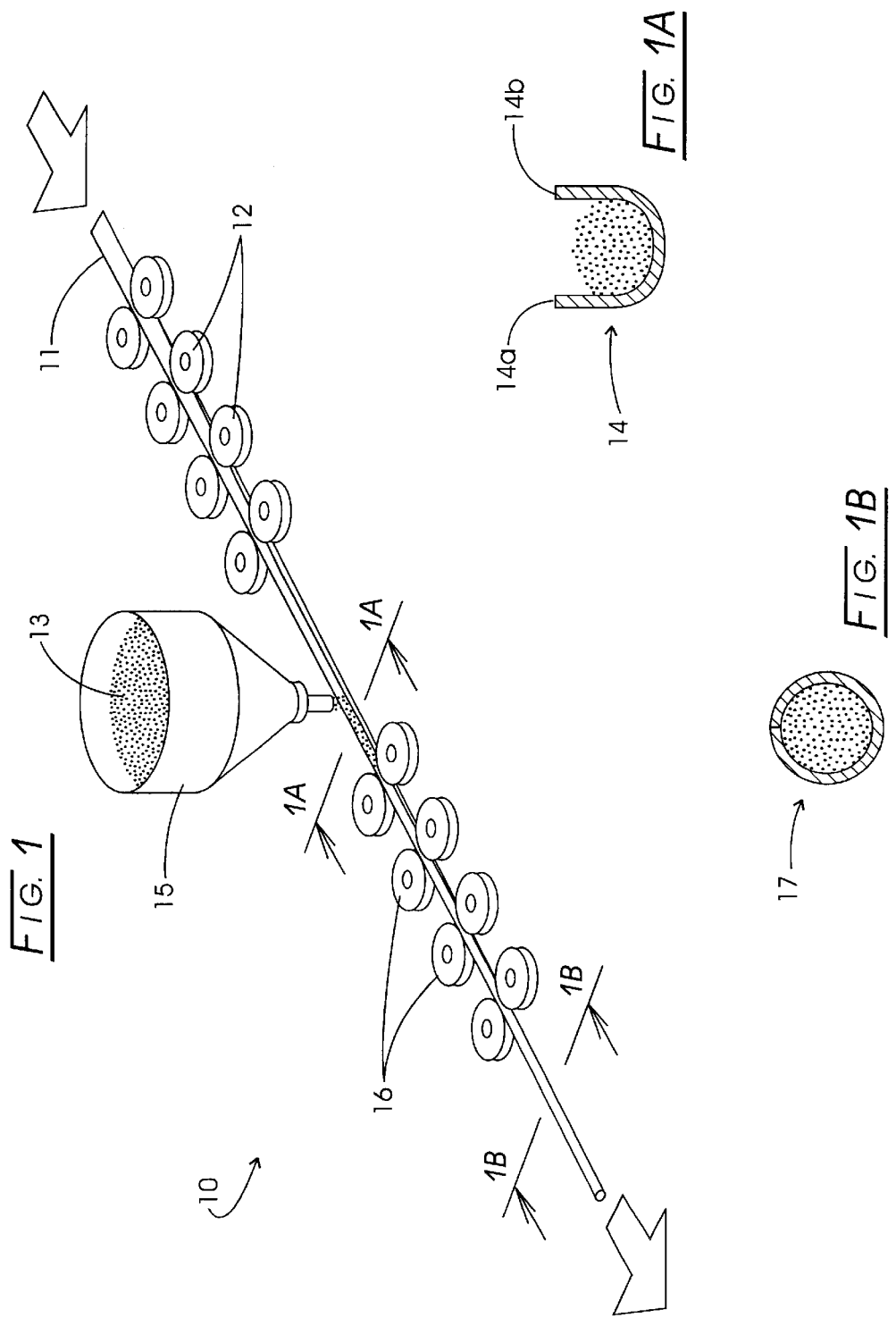
FIG. 1 is a schematic plan view of the continuous process apparatus of the present invention.

FIG. 1, FIG. 1a, and FIG. 1b disclose a continuous tube forming and filling apparatus 10 for providing a superconducting wire with magnesium diboride powder. A strip 11 of metal is shown in heavy dashed lines to show the path of travel of the strip. The strip 11 of metal can comprise any of a variety of metals, including silver, gold, platinum, palladium, rhodium, iridium, ruthenium, osmium, copper, aluminum, iron, nickel, chromium, titanium, molybdenum, tungsten, tantalum, niobium, magnesium, boron or vanadium, alloys and intermetallic mixtures thereof. Selection of the metal of the strip will be determined by reactivity of the metal with the superconducting material. In a preferred embodiment, the metal strip will comprise iron or niobium metals. The thickness of the metal strip is not critical and can be adjusted to the minimum thickness necessary for processing to small diameter wire.

It may be desirable, due to subsequent processing conditions in forming the metal tube, e.g., heat treatment or drawing, that the metal tube or formed tube consist of multiple tubes so that there are inner tube(s) and outer tube(s). Where the inner tube 22 (FIG. 2) can act as a barrier to prevent unwanted chemical reaction between the powder fill and the outer tube, the metal of the tube will most always be selected from a group of metals including nickel, titanium, molybdenum, tantalum, iron, niobium, tungsten, magnesium, vanadium, their alloys and intermetallic mixtures, and the like. Preferred materials for an inner tube include iron, niobium and tantalum. Whether or not an inner barrier tube 22 is used, an outer tube can also be utilized as a stabilizer to aid in distribution of currents during a quench. In such case, the outer tube 24 can be formed from a metal selected from the group including gold, silver, platinum, palladium, rhodium, copper and aluminum, with copper and aluminum being preferred. Another outer tube can be formed from a sacrificial material selected from the group of metals including carbon steel, stainless steel, copper-nickel, Monel®, or nickel alloy. Such a sacrificial material can aid in reducing the cross section of the wire, and in the final or intermediate stages of area reduction, can be removed by etching off the wire. Additionally, one of the tubes may be selected so as to provide mechanical strength to the final wire or tape, and in such case the tube material will be selected from the group including carbon, steel, stainless steel, copper-nickel, Monel®, or nickel alloy, and the like, with copper-nickel being preferred.

Referring again to FIG. 1, the strip 11 of metal is fed from a feed roll (not shown) between shaping dies 12 or forming rolls where it is bent to a U-shaped configuration 14.

Superconductive powder 13 is then fed into the U-shaped configuration 14 from a powder feed device 15. The powder 13 contents of the configuration 14 will be intermetallic compounds formed by a combination of Group IIA and Group IIIA elements of the Periodic Table, including magnesium, aluminum, titanium, boron, alchemy, and the like, and ternary, quaternary or higher order compounds based thereon. The powder may comprise Group II–III compounds, their constituent elements, or various combinations of compounds and elements. In a preferred embodiment, the superconductive powder will be magnesium diboride powder. The powder 13 may be formed by one or more operations, including compaction, sintering, melting, mechanical alloying, grinding, and the like, with melting and mechanical alloying being preferred. For tube filling, the powder 13 should be fine, and will generally be from about −600 mesh to about −325 mesh (U.S. standard), with particle size passing through 325 mesh being preferred. The powder 13 can also contain various additives to improve the superconducting properties of the wire, e.g., increasing the $T_c$ and or the transport current, $J_c$. Such additives can include titanium, magnesium oxide, and aluminum oxide.

The powder-filled, U-shaped configuration then proceeds through various closing dies 16 to form an O-shaped closed tube 17. The closed tube 17 is formed such that ends 14a, 14b of the U-shaped configuration overlap and are then mechanically bonded as the powder-filled tube 17 continues through any of a number of means for reducing the dimensional area of the tube 17. Means for area reduction are known to those skilled in the art and include wire drawing or forging by means of dies, roller dies, swager or extruder, and the like. Whichever means are selected for area reduction, the cross section of the metal tube 17 will generally be an annulus having a reduced dimensional area in an amount from about 15% to about 99%, depending on the final use of the wire and the current-carrying requirements. It is preferable that the reduction in dimensional area be from about 90% to about 99%.

Following area reduction, the metal tube 17 will proceed to heat treatment to sinter or chemically react the powder contents of the tube. Heat treatment of the tube 17 can occur continuously, such as with an inline furnace or resistive heating apparatus, or in a batch type oven. The heat treatment can involve a simple heating of the metal tube 17 to a specific temperature for a specified time, or may be such that the tube 17 is subjected to cycle of heating and cooling to various temperatures and for varying times. Heat treatment will generally be carried out at a temperature of from about 700° C. to about 1000° C. for a time of about one minute to about 2 hours. The metal tube 17 can then be wound into a coil or similar article. It is to be understood, however, that heat treatment may be performed either before or after winding of the tube 17.

Figure 2:
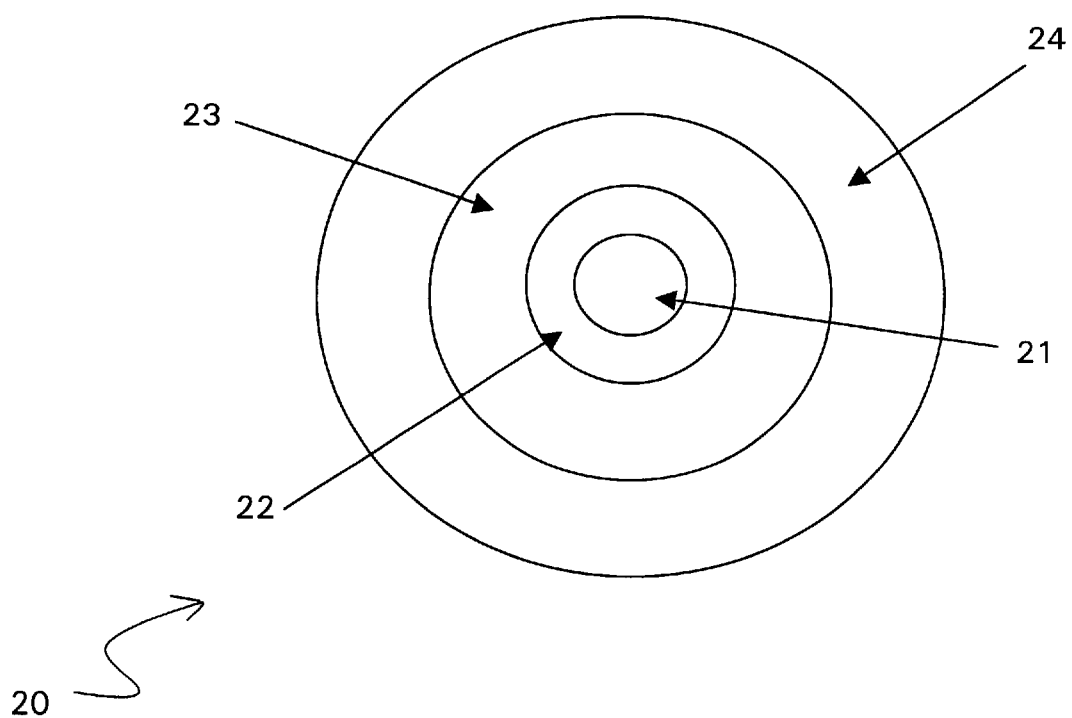
FIG. 2 is a cross-sectional view of a monofilament wire made by the process of the present invention.
Figure 3:
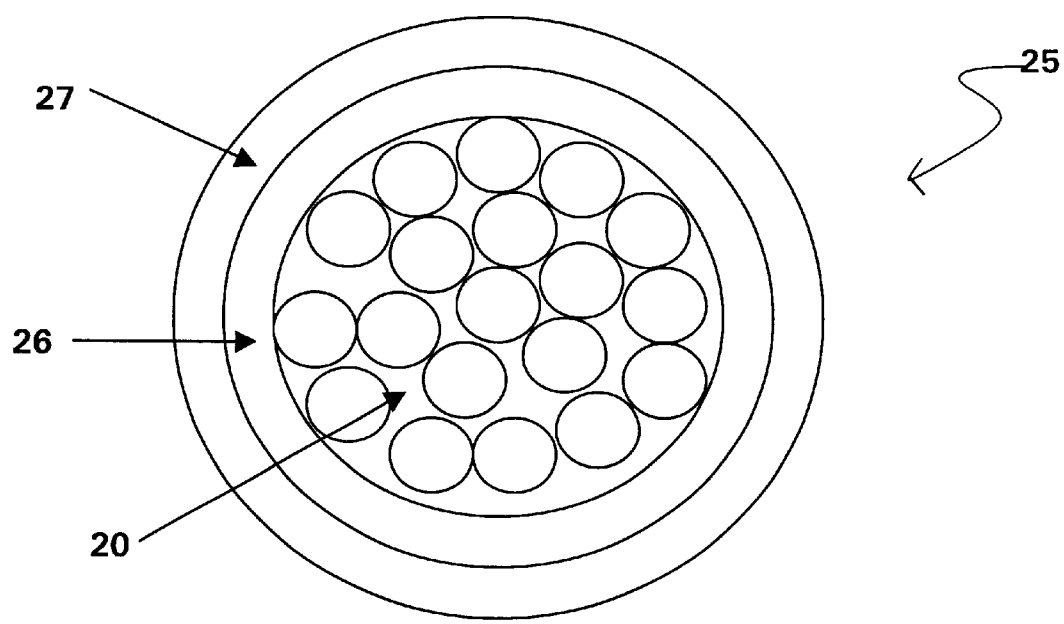
FIG. 3 is a cross-sectional view of a multifilament wire made by the process of the present invention.

Referring to FIG. 2, there is shown a monofilament wire 20 made by the process of the present invention. The monofilament 20 depicted comprises multiple tubes with a powder core 21 of superconducting material. The multiple tubes consist of an inner barrier tube 22, surrounded by a stabilizer tube 23, and an outer sacrificial drawing tube 24 or sheath for strength. These monofilament wires 20 can be restacked into another metal tube or formed tube and suitably reduced in area so as to yield a multifilamentary wire 25, as depicted in FIG. 3. The multifilamentary wire 25 can include an inner stabilizer tube 26 and outer sacrificial tube 27, or any combination of barrier 22 (FIG. 2), stabilizer 23, 26 and sacrificial 24, 27 tubes.

The following examples show ways in which the invention can be practiced and evaluated. However, the examples should not be construed as limiting the invention.

EXAMPLE 1

A continuous strip of niobium was fed through shaping dies and formed into a U-shape, the strip was filled with $MgB_2$ powder, and then closed through shaping dies to form a continuous tube with overlapped edges to make a wire. This formed niobium tube with $MgB_2$ powder, now a wire was then fed into a continuously formed Monel (nickel-copper alloy) tube. The continuous Monel strip was fed through shaping dies and formed into a U-shape, the strip was filled with the previously made niobium powder-filled tube. The Monel U-shaped strip, containing the niobium filled tube, was then fed through closing dies such that the tube edges of the Monel tube were overlapped to thus form a closed tube around the niobium tube. This multi-layer tube was then drawn through conical dies to form a wire, 50 mils in diameter and subsequently rolled into tapes 2.56×0.32 mm², with a total superconducting cross section of 0.2319 mm².

Three samples of the tube were encapsulated under Argon and reacted at 900° C. for 1, 2 and 3 hours, respectively. Transport $J_c$ measurements were made in liquid helium at self field using the standard direct current four-probe method in a cryostat. M-H loops were measured using an EG&G PAR vibrating sample magnetometer with a 1.7T iron core magnet. Results are indicated in Table 1.

| Sample | Heat Treatment | Superconductor Area, mm² | $I_c$ (4.2K, self field) A | $J_c$ (4.2K, self field) A/cm² |
|---|---|---|---|---|
| 1 | 900° C./1 hour | 0.23 | 108 | 4.7 × 10⁴ |
| 2 | 900° C./2 hour | 0.23 | 173 | 7.5 × 10⁴ |
| 3 | 900° C./3 hour | 0.23 | 25 | 1.1 × 10⁴ |

The results indicate that the wires made utilizing the process of the present invention were superconducting.

What is claimed is:

1. A process for the continuous formation of a superconducting wire, comprising the steps of:
   providing a continuous strip of metal;
   forming said strip into a semi-closed configuration;
   filling said semi-closed configuration with an intermetallic material comprising magnesium diboride powder;
   closing said semi-closed configuration to form a closed tube;
   deforming said filled tube to reduce a cross section of said tube;
   subjecting said deformed tube to heat treatment.

2. A process according to claim 1, wherein said continuous strip of metal is one or more of silver, gold, platinum, palladium, rhodium, iridium, ruthenium, osmium, copper, aluminum, iron, nickel, chromium, titanium, molybdenum, tungsten, tantalum, niobium, magnesium, boron or vanadium, alloys and intermetallic mixtures thereof.

3. A process according to claim 2, wherein said continuous strip is iron or niobium.

4. A process according to claim 1, wherein said U-shaped configuration is formed as by shaping dies.

5. A process according to claim 3, wherein said magnesium diboride powder has a U.S. standard mesh particle size of minus 325 mesh.

6. A process according to claim 5, wherein said magnesium diboride powder comprises the compound of magnesium diboride, its constituent elements, or various combinations of compounds and elements.

7. A process according to claim 6, wherein said magnesium diboride powder further includes titanium, magnesium oxide and and/or aluminum oxide.

8. A process according to claim 3, wherein said closed tube is deformed to reduce said cross section of said tube as by one or more of wire drawing or forging by means of dies, roller dies, swager or extruder.

9. A process according to claim 8, wherein said cross section of said tube is reduced from about 15% to about 99%.

10. A process according to claim 8, wherein said closed tube is heat treated at a temperature of about 700° C. to about 1000° C.

11. A process according to claim 6, further including the step of providing one or more of a barrier tube, a stabilizer tube, or a sacrificial tube.

12. A process according to claim 11, wherein said barrier tube comprises a metal selected from the group consisting of nickel, titanium, iron, niobium, molybdenum, tantalum, tungsten, magnesium or vanadium, their alloys and intermetallic mixtures thereof.

13. A process according to claim 12, wherein said barrier tube is iron or niobium.

14. A process according to claim 11, wherein said stabilizer tube comprises a metal selected from the group consisting of silver, gold, platinum, palladium, rhodium, copper or aluminum, their alloys and intermetallic mixtures thereof.

15. A process according to claim 14, wherein said stabilizer tube is copper, aluminum or silver.

16. A process according to claim 11, wherein said sacrificial tube comprises a metal selected from the group consisting of carbon steel, stainless steel, copper-nickel, Monel or nickel alloy, with alchemy being preferred.

17. A monofilament wire made by the process of claim 1.

18. A multifilament wire made by the process of claim 1.

* * * * *